United States Patent
Rosas et al.

(10) Patent No.: US 10,852,322 B1
(45) Date of Patent: Dec. 1, 2020

(54) HIGH-FREQUENCY DATA DIFFERENTIAL TESTING PROBE

(71) Applicant: Signal Microwave, LLC, Chandler, AZ (US)

(72) Inventors: William Rosas, Chandler, AZ (US); Eric Gebhard, Scottsdale, AZ (US); Brian Shumaker, San Carlos, CA (US)

(73) Assignee: SIGNAL MICROWAVE, LLC, Chandler, AZ (US)

( * ) Notice: Subject to any disclaimer, the term of this patent is extended or adjusted under 35 U.S.C. 154(b) by 81 days.

(21) Appl. No.: 16/214,015

(22) Filed: Dec. 7, 2018

Related U.S. Application Data

(60) Provisional application No. 62/596,430, filed on Dec. 8, 2017.

(51) Int. Cl.
*G01R 1/073* (2006.01)
*G01R 31/28* (2006.01)
*G01R 1/067* (2006.01)

(52) U.S. Cl.
CPC ..... *G01R 1/07392* (2013.01); *G01R 1/06755* (2013.01); *G01R 1/06772* (2013.01); *G01R 1/07342* (2013.01); *G01R 31/2886* (2013.01)

(58) Field of Classification Search
CPC ............ G01R 1/07392; G01R 1/07342; G01R 31/2886; G01R 1/06755; G01R 1/06772
See application file for complete search history.

(56) References Cited

U.S. PATENT DOCUMENTS

| 2002/0057098 A1* | 5/2002 | Aldaz | G01R 1/07342 324/750.16 |
| 2006/0152232 A1* | 7/2006 | Shvets | G01R 31/2822 324/750.02 |
| 2007/0075726 A1* | 4/2007 | Chan | G01R 1/0735 324/754.18 |
| 2008/0246501 A1* | 10/2008 | Williams | G01R 1/073 324/755.07 |

* cited by examiner

*Primary Examiner* — Akm Zakaria
(74) *Attorney, Agent, or Firm* — Booth Udall Fuller, PLC

(57) ABSTRACT

A high-frequency testing probe having a probe substrate and at least two probe tips. The probe substrate is a printed circuit board and the probe tips are coupled to and extend outward from the printed circuit board. The first and second probe tips are each communicatively coupled to respective first and second probe connectors through respective first and second conducting traces disposed upon the printed circuit board. The probe connectors are configured to couple the testing probe to at least one of a high-frequency vector network analyzer and a high-frequency time domain reflectometer. The probe tips translate along their respective central longitudinal axes through respective adjustable couplings to modify respective distances the probe tips extend outward from the printed circuit board.

20 Claims, 10 Drawing Sheets

HIGH-FREQUENCY DATA DIFFERENTIAL TESTING PROBE

RELATED APPLICATIONS

This application claims the benefit of U.S. provisional patent application 62/596,430, filed Dec. 8, 2017 titled "High-Frequency Data Differential Testing Probe," the entirety of the disclosure of which is hereby incorporated by this reference.

TECHNICAL FIELD

Aspects of this document relate generally to high frequency data differential testing probes.

BACKGROUND

With the increasing bandwidth demands of internet connectivity, cloud computing, and wireless communications, the demand for extremely high frequency radio data transmission continues to grow. In addition to radio frequency transmissions through antennas, transmission of data on a circuit board from one chip to another and over a cable or backplane from one device to another, as well as transmission through fiber optics also involves and benefits from extremely high frequency data transmission.

Such extremely high frequency data transmission requires components, including semiconductor devices, capable of processing these high frequency data signals. During development of these high-frequency components it is generally necessary for researchers to test the functionality of the component under design over its intended frequency range. Once developed, it is also desirable to test manufactured components to verify frequency response and other functionality in accordance with specified tolerances. In both cases, the testing of the component is typically accomplished through the use of testing probes connected to a vector network analyzer (VNA), time domain reflectometer (TDR), oscilloscope, spectrum analyzer, bit error rate tester (BERT) or other measurement equipment.

Conventional testing probes typically include two or more electrodes which are placed on conducting contact points on the surface of the component being tested. The electrodes are attached to a single cable composed of multiple conductive wires for transmitting electrical signals to and from connected measurement equipment. Such cable testing probes have been used to reliably test signal frequencies of up to 25 GHz.

Working within the extremely high frequency regime has its own set of difficulties. Testing equipment, particularly testing probes that interface the test equipment with the device been evaluated, are particularly sensitive to deviations from an often tight set of tolerances. High frequency testing probes can be expensive and slow to develop and manufacture with consistent, reliable performance at high frequencies.

SUMMARY

According to an aspect of the disclosure, a high-frequency testing probe may comprise a probe substrate comprising a printed circuit board, a probe housing enclosing the printed circuit board, and at least two probe tips directly coupled to and extending outward from the printed circuit board, each probe tip having a first end and a second end, the at least two probe tips comprising a first probe tip communicatively coupled to a first probe connector of a plurality of probe connectors through a first conducting trace of a plurality of conducting traces disposed upon the printed circuit board, the first conducting trace being electrically isolated and communicatively coupling the first probe tip only to the first probe connector, the first probe tip passing through the probe housing such that the first end of the first probe tip is outside the probe housing and the second end of the first probe tip is inside the probe housing and proximate a first adjustment aperture in the probe housing, and a second probe tip communicatively coupled to a second probe connector of the plurality of probe connectors through a second conducting trace of the plurality of conducting traces, the second conducting trace being electrically isolated and communicatively coupling the second probe tip only to the second probe connector, the second probe tip passing through the probe housing such that the first end of the second probe tip is outside the probe housing and the second end of the second probe tip is inside the probe housing and proximate a second adjustment aperture in the probe housing, wherein the plurality of probe connectors are disposed upon the printed circuit board and are configured to couple the high-frequency testing probe to at least one of a high-frequency vector network analyzer and a high-frequency time domain reflectometer, wherein the first probe tip comprises a first threading and is threadedly received by and coupled to the probe housing through a first adjustable coupling, wherein turning the second end of the first probe tip rotates the first threading within the first adjustable coupling and changes a first distance the first end of the first probe tip extends outward from the printed circuit board, wherein the second probe tip comprises a second threading and is threadedly received by and coupled to the probe housing through a second adjustable coupling, wherein turning the second end of the second probe tip rotates the second threading within the second adjustable coupling and changes a second distance the first end of the second probe tip extends outward from the printed circuit board, wherein the first probe tip is coupled to the printed circuit board at a first angle with respect to a plane of the printed circuit board between 10° and 90°, the first and second ends of the first probe tip being on opposite sides of the plane of the printed circuit board, and wherein the second probe tip is coupled to the printed circuit board at a second angle with respect to the plane of the printed circuit board between 0° and 90°, the first and second ends of the second probe tip being on opposite sides of the plane of the printed circuit board.

Particular embodiments may comprise one or more of the following features. The first probe tip may be coupled to the printed circuit board at a third angle with respect to the second probe tip between 0° and 90°. The probe tips may be cylindrical and comprise heat-treated BeCu. The at least two probe tips may comprise at least three probe tips. The printed circuit board may comprise polytetrafluoroethylene (PTFE).

According to an aspect of the disclosure, a high-frequency testing probe may comprise a probe substrate comprising a printed circuit board, at least two probe tips directly coupled to and extending outward from the printed circuit board, each probe tip having a first end and a second end, the at least two probe tips comprising a first probe tip communicatively coupled to a first probe connector of a plurality of probe connectors through a first conducting trace of a plurality of conducting traces disposed upon the printed circuit board, the first conducting trace being electrically isolated and communicatively coupling the first probe tip only to the first probe connector, and a second probe tip communicatively coupled to a second probe connector of the plurality of probe connectors through a second conducting trace of the plurality of conducting traces, the second conducting trace being electrically isolated and communicatively coupling the second probe tip only to the second probe connector, wherein the plurality of probe connectors are disposed upon the printed circuit board and are configured to couple the high-frequency testing probe to at least one of a high-frequency vector network analyzer and a high-frequency time domain reflectometer, wherein the first probe tip is received by and adjustably coupled to a first adjustable coupling, wherein the first probe tip translates along its central longitudinal axis through the first adjustable coupling to modify a first distance the first end of the first probe tip extends outward from the printed circuit board, wherein the second probe tip is received by and adjustably coupled to a second adjustable coupling, wherein the second probe tip translates along its central longitudinal axis through the second adjustable coupling to modify a second distance the first end of the second probe tip extends outward from the printed circuit board.

Particular embodiments may comprise one or more of the following features. The first probe tip may comprise a first threading and is threadedly received by the first adjustable coupling, wherein turning the second end of the first probe tip rotates the first threading within the first adjustable coupling and changes the first distance the first end of the first probe tip extends outward from the printed circuit board. The second probe tip may comprise a second threading and is threadedly received by the second adjustable coupling, wherein turning the second end of the second probe tip rotates the second threading within the second adjustable coupling and changes the second distance the first end of the second probe tip extends outward from the printed circuit board. The first probe tip may be coupled to the printed circuit board at a first angle with respect to a plane of the printed circuit board between 10° and 90°, the first and second ends of the first probe tip being on opposite sides of the plane of the printed circuit board. The first probe tip may be coupled to the printed circuit board at a third angle with respect to the second probe tip between 0° and 90°. The at least two probe tips may be cylindrical. A probe housing enclosing a majority of the printed circuit board. The first probe tip may pass through the probe housing such that the first end of the first probe tip is outside the probe housing and the second end of the first probe tip may be proximate a first adjustment aperture in the probe housing. The second probe tip may pass through the probe housing such that the first end of the second probe tip is outside the probe housing and the second end of the second probe tip may be proximate a second adjustment aperture in the probe housing. The printed circuit board may comprise polytetrafluoroethylene (PTFE).

According to an aspect of the disclosure, a high-frequency testing probe may comprise a probe substrate comprising a printed circuit board, at least two probe tips directly coupled to and extending outward from the printed circuit board, each probe tip having a first end and a second end, the at least two probe tips comprising a first probe tip communicatively coupled to a first probe connector of a plurality of probe connectors through a first conducting trace of a plurality of conducting traces disposed upon the printed circuit board, the first conducting trace being electrically isolated and communicatively coupling the first probe tip only to the first probe connector, and a second probe tip communicatively coupled to a second probe connector of the plurality of probe connectors through a second conducting trace of the plurality of conducting traces, the second conducting trace being electrically isolated and communicatively coupling the second probe tip only to the second probe connector, wherein the plurality of probe connectors are disposed upon the printed circuit board and are configured to couple the high-frequency testing probe to at least one of a high-frequency vector network analyzer and a high-frequency time domain reflectometer.

Particular embodiments may comprise one or more of the following features. The first probe tip may be received by and adjustably coupled to a first adjustable coupling, wherein the first probe tip translates along its central longitudinal axis through the first adjustable coupling to modify a first distance the first end of the first probe tip extends outward from the printed circuit board. The first probe tip may comprise a first threading and is threadedly received by the first adjustable coupling, wherein turning the second end of the first probe tip rotates the first threading within the first adjustable coupling and changes the first distance the first end of the first probe tip extends outward from the printed circuit board. The first probe tip may be coupled to the printed circuit board at a first angle with respect to a plane of the printed circuit board between 10° and 90°. The first probe tip may be coupled to the printed circuit board at a third angle with respect to the second probe tip between 0° and 90°. The probe tips may comprise heat-treated BeCu. A probe housing enclosing a majority of the printed circuit board. The first probe tip may pass through the probe housing such that the first end of the first probe tip is outside the probe housing and the second end of the first probe tip may be proximate a first adjustment aperture in the probe housing. The second probe tip may pass through the probe housing such that the first end of the second probe tip is outside the probe housing and the second end of the second probe tip may be proximate a second adjustment aperture in the probe housing. The printed circuit board may comprise polytetrafluoroethylene (PTFE).

Aspects and applications of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

The disclosure will hereinafter be described in conjunction with the appended drawings, where like designations denote like elements, and.

DETAILED DESCRIPTION

Figure 1:
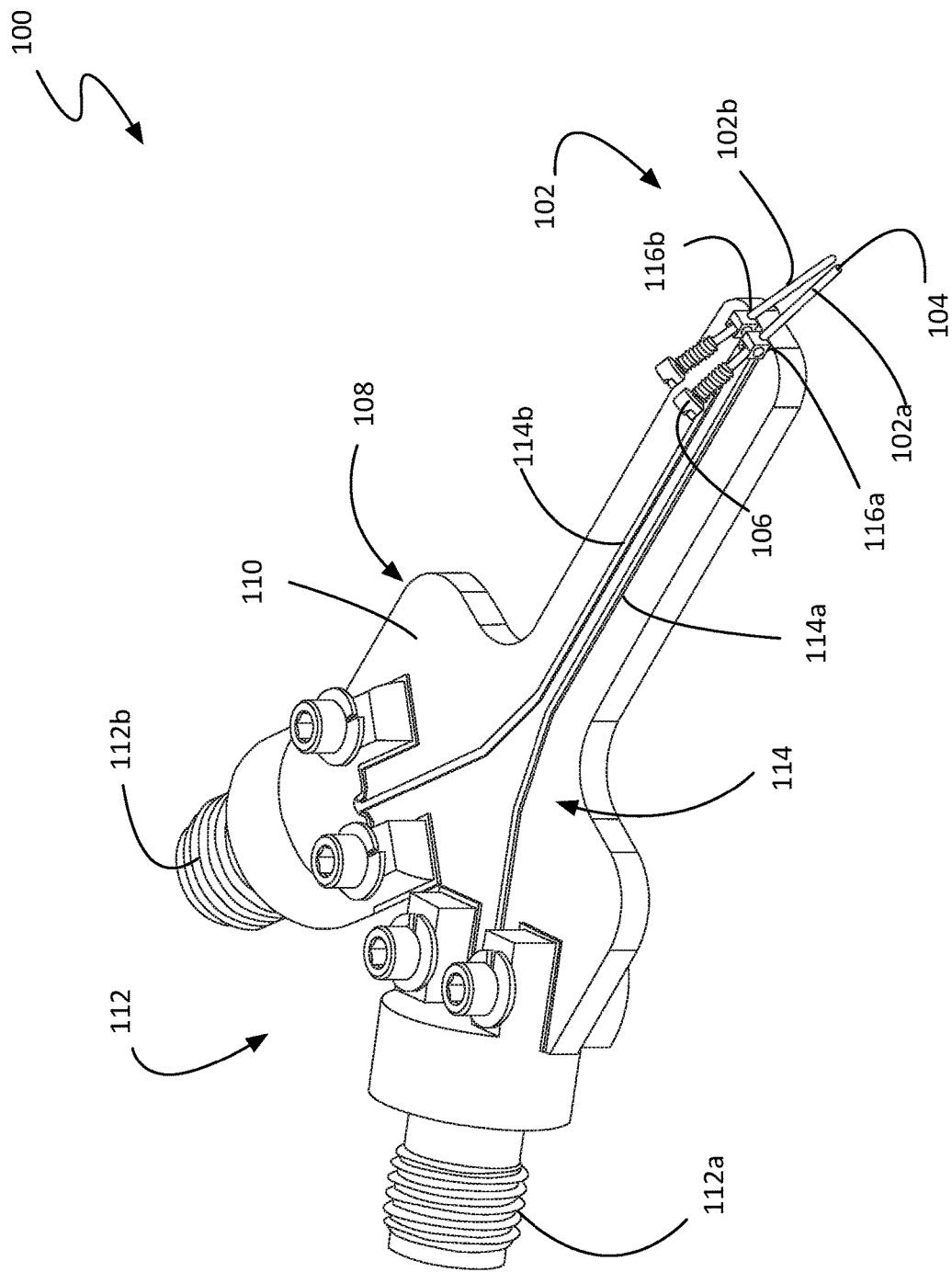
FIG. 1 is a perspective view of a high frequency testing probe.

This disclosure, its aspects and implementations, are not limited to the specific material types, components, methods, or other examples disclosed herein. Many additional material types, components, methods, and procedures known in the art are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

While this disclosure includes a number of embodiments in many different forms, there is shown in the drawings and will herein be described in detail particular embodiments with the understanding that the present disclosure is to be considered as an exemplification of the principles of the disclosed methods and systems, and is not intended to limit the broad aspect of the disclosed concepts to the embodiments illustrated.

With the increasing bandwidth demands of internet connectivity, cloud computing, and wireless communications, the demand for extremely high frequency radio data transmission continues to grow. In addition to radio frequency transmissions through antennas, transmission of data on a circuit board from one chip to another and over a cable or backplane from one device to another, as well as transmission through fiber optics also involves and benefits from extremely high frequency data transmission.

Such extremely high frequency data transmission requires components, including semiconductor devices, capable of processing these high frequency data signals. During development of these high-frequency components it is generally necessary for researchers to test the functionality of the component under design over its intended frequency range. Once developed, it is also desirable to test manufactured components to verify frequency response and other functionality in accordance with specified tolerances. In both cases, the testing of the component is typically accomplished through the use of testing probes connected to a vector network analyzer (VNA), time domain reflectometer (TDR), oscilloscope, spectrum analyzer, bit error rate tester (BERT) or other measurement equipment.

Working within the extremely high frequency regime has its own set of difficulties. Testing equipment, particularly testing probes that interface the test equipment with the device been evaluated, are particularly sensitive to deviations from an often tight set of tolerances. High frequency testing probes can be expensive and slow to develop and manufacture with consistent, reliable performance at high frequencies.

Conventional testing probes typically include two or more electrodes which are placed on conducting contact points on the surface of the component being tested. The electrodes are attached to a single cable composed of multiple conductive wires for transmitting electrical signals to and from connected measurement equipment. Such cable testing probes have been used to reliably test signal frequencies of up to 25 GHz.

Contemplated herein is a high-frequency testing probe making use of a printed circuit board (PCB) to join probe tips to connectors linked to test equipment. This deviation from the conventional method of using wire or cable as the transmission line joining the probe tips to the connectors provides a number of advantages, including a significantly improved range of frequencies that can be reliably tested. Some embodiments have consistently shown operating ranges as high as 40-70 GHz, with others venturing even higher. Additionally, the testing probes contemplated herein are easier to manufacture and customize than conventional probes. Rather than having to setup and extrude a new batch of cable to tune a probe redesign (e.g. hitting a target impedance, etc.), a PCB can be quickly fabricated, tested, and refined. PCB fabrication can be done with a degree of precision well beyond conventional methods, and at lower cost.

Figure 2:
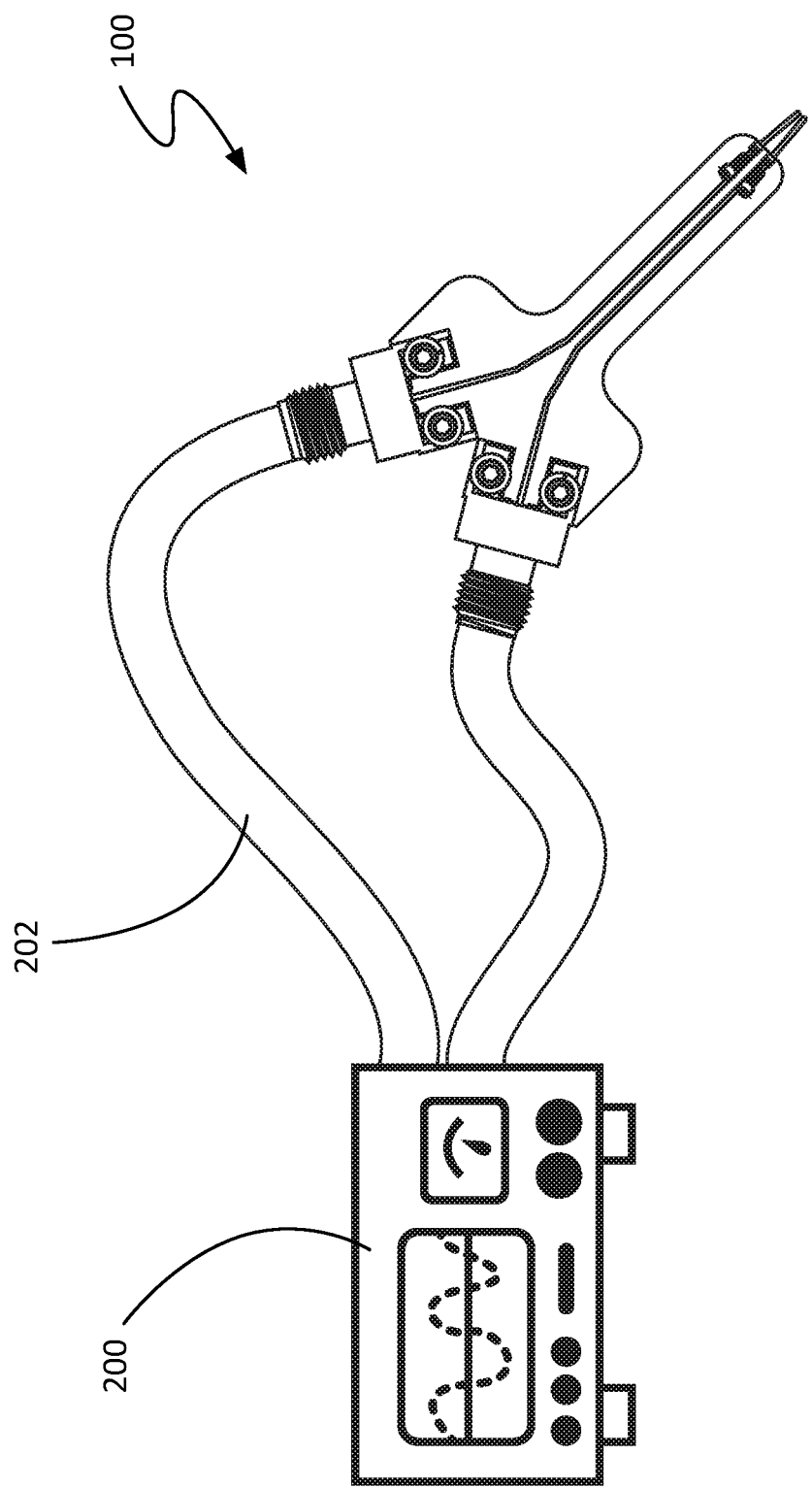
FIG. 2 is a system view of a high frequency testing probe and a testing device.
Figure 3A:
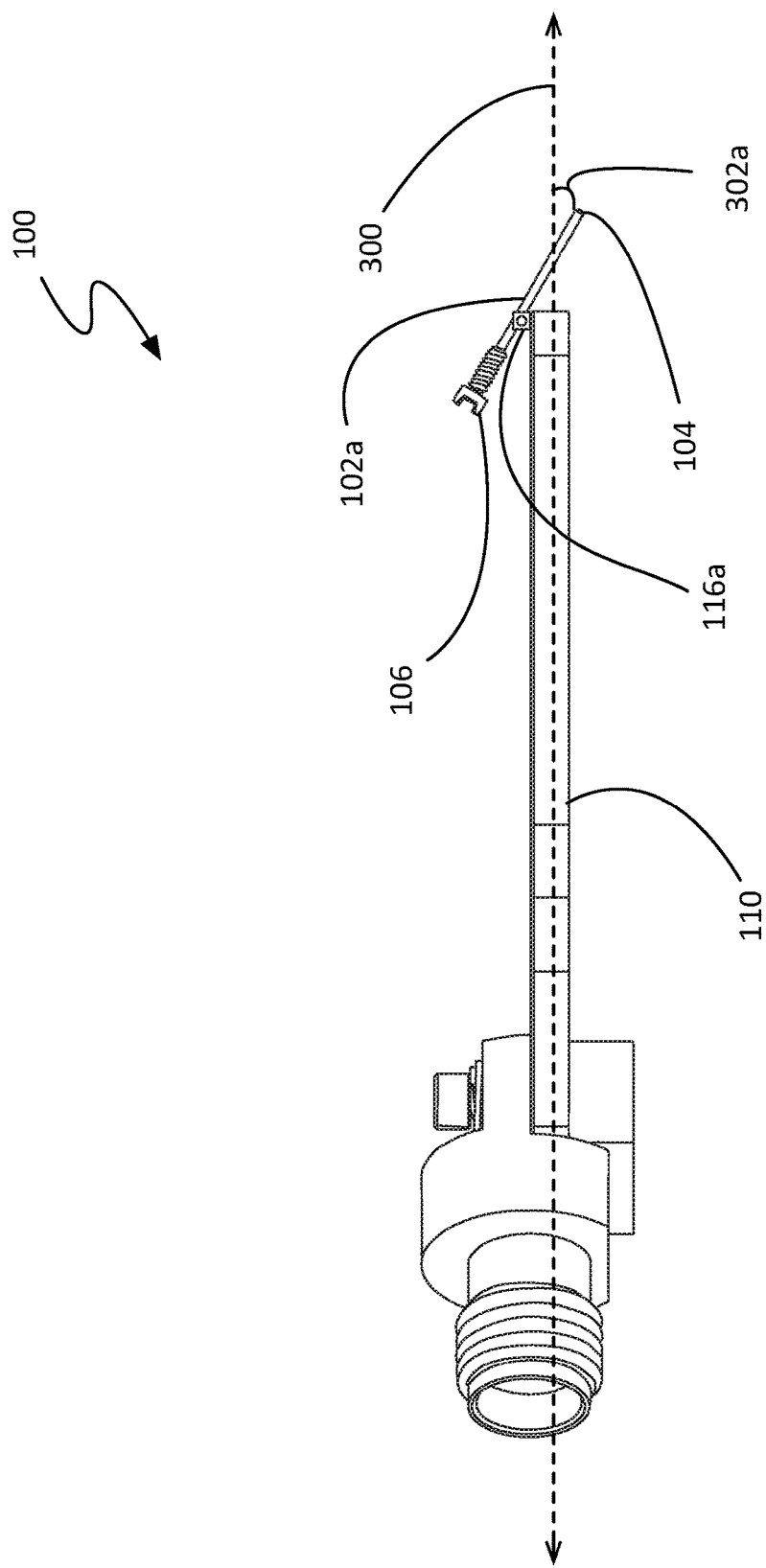
FIGS. 3A and 3B are side views of a high frequency testing probe.
Figure 3B:
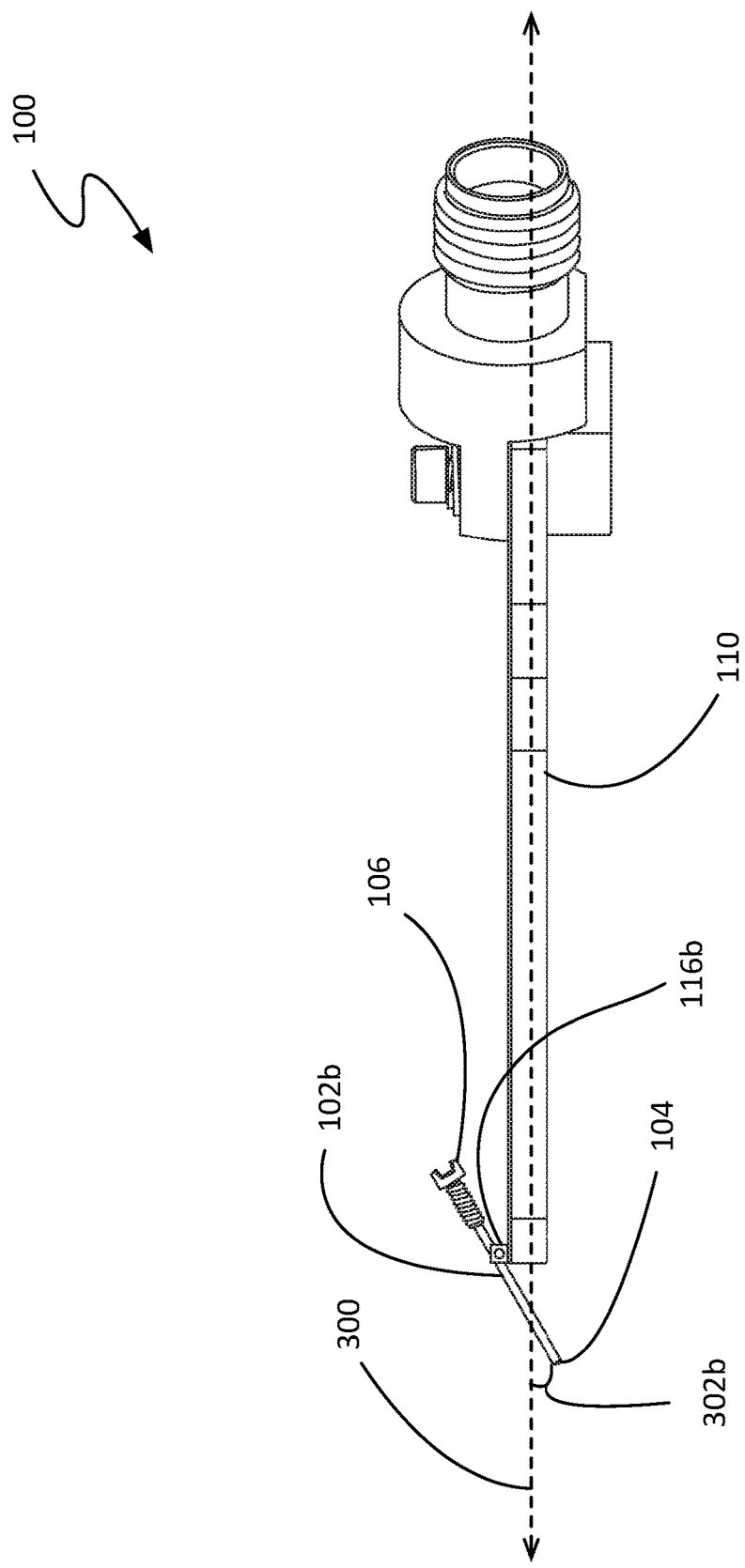
Figure 4:
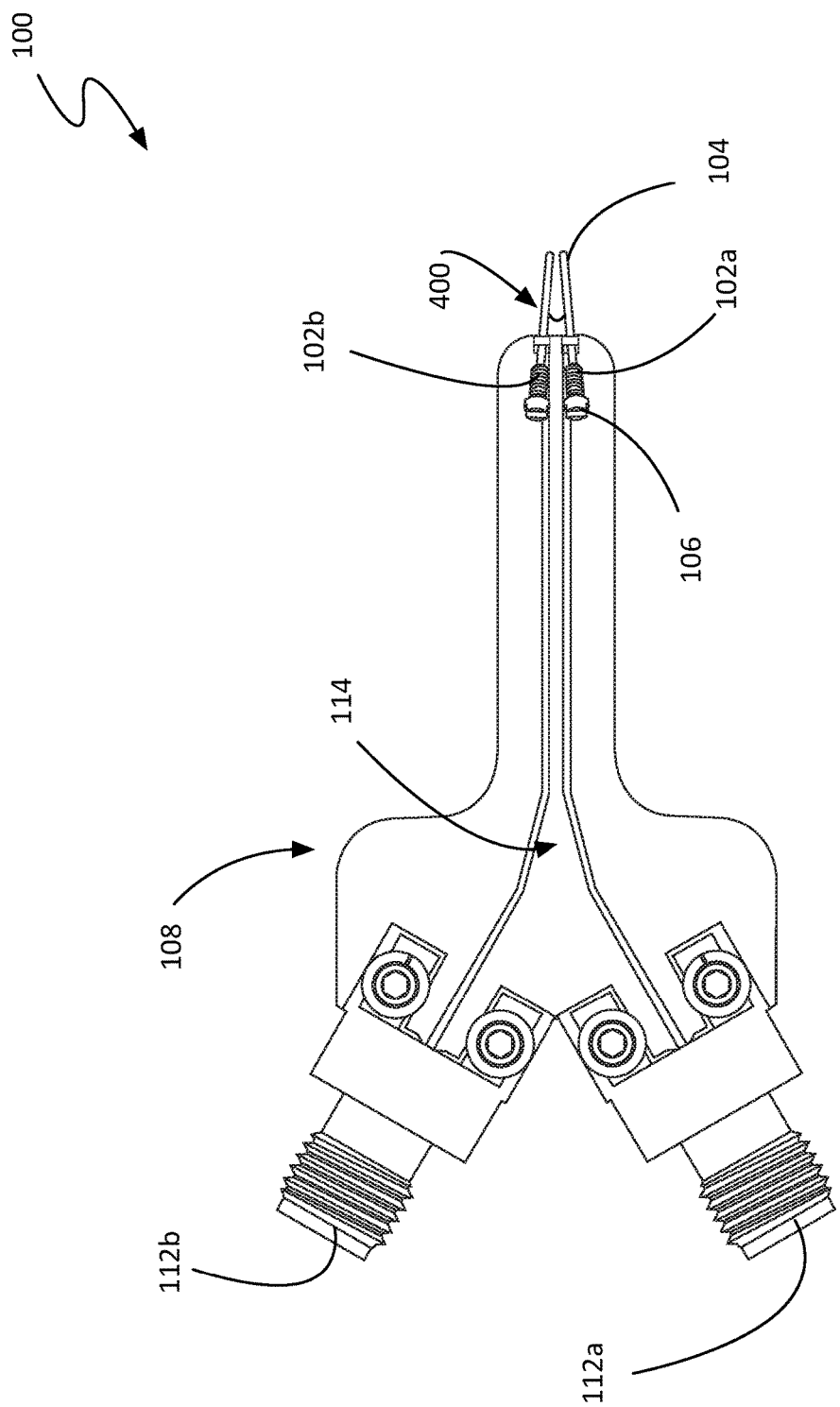
FIG. 4 is a top view of a high frequency testing probe.

FIGS. 1-4 show various views of a non-limiting example of a high-frequency testing probe 100. Specifically, FIG. 1 is a perspective view, FIG. 2 is a system view, FIGS. 3A and 3B are left and right side views, and FIG. 4 is a top view.

FIG. 1 shows an exemplary embodiment of a new high-frequency testing probe 100. While the descriptor "new" is used above to differentiate the new high-frequency testing probe from "conventional" cable testing probes, for convenience and ease of description, subsequent references will refer to the new high-frequency testing probe simply as the "data testing probe" "testing probe" or "probe" as distinguished from "conventional" testing probes. For additional convenience and ease of description, a number of relative positional descriptors, such as "left," "right," "front," "rear," "top," and "bottom" are used by way of illustration and not by way of limitation.

As shown, the high-frequency testing probe 100 (hereinafter probe 100 or testing probe 100) comprises a plurality of probe tips 102, each coupled to a different probe connectors 112 through an electrically isolated conducting trace 114 disposed on a probe substrate 108.

According to various embodiments, the testing probe 100 comprises a plurality of probe tips 102. In the context of the present description and the claims that follow, a probe tip is the conductive portion that makes contact with the device or circuit being tested, ultimately forming a connection to test equipment.

While much of the discussion regarding various embodiments of the contemplated testing probes 100 will be done with respect to probes 100 having two probe tips 102 (i.e. first probe tip 102a and second probe tip 102b), as well as two conducting traces 114 (i.e. first conducting trace 114a and second conducting trace 114b), and two probe connectors 112 (i.e. first probe connector 112a and second probe connector 112b), it should be understood that other embodiments may make use of three, four, or more probe tips 102 and accompanying structure. In no way should the use of exemplary embodiments with two probe tips 102 be construed as limiting the number of probe tips 102 in other embodiments. In some embodiments, the testing probe 100 operates as a data differential probe.

As shown, the probe tips 102 each have a first end 104 that is put in contact with the testing subject, and a second end 106 distal to the first end. According to some embodiments, the second end 106 may be configured to receive a tool head (e.g. slotted for a screwdriver, etc.), to facilitate adjustments. The various embodiments having adjustable probe tips 102 will be discussed further with respect to FIGS. 3A, 3B, 4, 7A, and 7B.

According to various embodiments, the probe tips 102 may be composed of a variety of conducting materials including, but not limited to, gold, copper, aluminum, alloys (e.g. alloys containing gold, copper, aluminum, brass, steel, etc.), other alloys such as tellurium copper, and the like. In one specific embodiment, the probe tips 102 comprise beryllium copper, for durability. As an option, the beryllium copper may be heat-treated.

In some embodiments, the probe tips 102 may be of uniform composition. In other embodiments, the probe tips 102 may be plated. For example, in some embodiments, the probe tips 102 may be plated using nickel, tin, zinc, or any other plating material known in the art.

As shown, in some embodiments, the probe tips 102 may be cylindrical in shape, while in others they may be flat. In still other embodiments, the probe tips 102 may have any other shape known in the art for electrodes or probes. As a specific example, in one embodiment, the probe tips 102 are cylindrical, having a diameter of 30 mils, and are at least 250 mils in length. Other embodiments may make use of probe tips 102 having larger or smaller diameters, depending, at least in part, upon material strength and intended use environment.

As shown, the testing probe 100 comprises a probe substrate 108, that provides a platform to which the other components are attached. As discussed above, the use of a printed circuit board 110 as the probe substrate 108 provides both performance and manufacturing advantages. According to various embodiments, the probe substrate 108 comprises a printed circuit board 110 (PCB). The printed circuit board 110 may comprise materials suitable for high-frequency applications, including but not limited to hydrocarbon ceramic laminates, polytetrafluoroethylene (PTFE), ceramic-filled PTFE, or other materials known in the art to be compatible with high-frequency signals. In one specific embodiment, the printed circuit board 110 may be RO4003, and may be 8 mils thick.

Each probe tip 102 is coupled to, and in electronic communication with, a unique conducting trace 114 disposed on the printed circuit board 110. In some embodiments, the probe tip 102, or more specifically the second end 106 of a probe tip 102, may be soldered to its conducting trace 114 (e.g. soldered to a solder pad integral with the trace 114, etc.). In other embodiments, a probe tip 102 may be coupled to the printed circuit board 110 through respective first and second conductive couplings 116a, 116b.

In the context of the present description and the claims that follow, a conductive coupling 116a, 116b is a conductive structure configured to communicatively and mechanically couple to a conducting trace 114 on a PCB, and is further configured to receive a probe tip 102 such that the probe tip 102 is communicatively coupled to the trace 114. In some embodiments, the conductive coupling 116a, 116b may serve to hold the probe tip 102 in a particular orientation with respect to the printed circuit board 110 (or more specifically, a plane 300 of the PCB 110; see FIGS. 3A and 3B) and/or with respect to other probe tips 102.

In some embodiments, probe tips 102 may be positioned in close proximity to each other. For example, in one embodiment, the first probe tip 102a and second probe tip 102b may be as close as 8 mils from each other. In another embodiment, the tips may be even closer.

In some embodiments, the probe tip 102 may be fixedly coupled to the conductive coupling 116a, 116b. For example, the probe tip 102 may be soldered to the conductive coupling 116a, 116b. In other embodiments, the probe tip 102 may be releasably coupled to the conductive coupling 116a, 116b, allowing it to be moved in some way without interrupting or degrading the electronic communication between the probe tip 102 and its associated trace 114 through the conductive coupling 116a, 116b. For example, in some embodiments, the probe tip 102 may be pressure fit within a channel of the conductive coupling 116a, 116b, and may be held in place through some other structure, such as a probe housing 500. In other embodiments, the probe tip 102 may be movably coupled to the conductive coupling 116a, 116b such that external force is required to cause movement, and in the absence of external force, the conductive coupling 116a, 116b will hold the probe tip 102 in place (e.g. the probe tip 102 is threadedly coupled to the conductive coupling 116a, 116b, etc.).

In some embodiments, the orientation and/or relative position of a probe tip 102 may be adjustable. This adjustability may accomplished using one or more adjustable couplings, which in some embodiments are also conductive couplings 116a, 116b. Probe tip 102 orientations and adjustability will be discussed further with respect to FIGS. 3A, 3B, 4, 7A, and 7B, below.

According to various embodiments, each conducting trace 114 leads to one of a plurality of probe connectors 112. In the context of the present description and the claims that follow, a probe connector 112 is a terminal configured to couple with a high-frequency cable or other conduit known in the art, to couple with a receiving port or terminal on a testing device. It should be noted that while FIG. 1 and other figures show threaded probe connectors 112, a variety of connection terminals types are encompassed within this disclosure.

In contrast to conventional testing probes, the testing probes 110 contemplated herein make use of conducting traces 114 disposed on a PCB 110 as transmission lines connecting the probe tips 102 to the probe connectors 112. Each probe tip 102 has its own, isolated conducting trace 114. For example, as shown in FIG. 1, the first probe tip 102a is coupled to the first conducting trace 114a that is also coupled to the first probe connector 112a, and nothing else. Each conducting trace 114 is electrically isolated from the other elements of the probe 100, except for a single probe tip 102 and a single probe connector 112, according to various embodiments. It should be noted that, in the context of the present description and the claims that follow, "electrically isolated" means a limitation on direct connections (e.g. a trace 114 does not connect to more than one tip 102, etc.), and should not be construed to mean a complete absence of all electrical interaction with other elements, which is often unavoidable.

The conducting traces 114 may be disposed on the printed circuit board 110 of the probe substrate 108 using any method known in the art. In some embodiments, particularly where the probe tips 102 are positioned near each other, conducting traces 114 can be situated near each other as well. As a specific example, in one embodiment, a first conducting trace 114a and second conducting trace 114b may each be 11 mils wide, and may be separated from each other by 15 mils proximate the associated probe tips 102a and 102b.

FIG. 2 is a system view of a non-limiting example of a high-frequency testing probe 100 coupled to a testing device 200 through a high-frequency cable 202. According to various embodiments, the testing probe 100 may be used in conjunction with a high frequency testing device, such as a vector network analyzer (VNA), a time domain reflectometer (TDR), a bit error rate tester (BERT), or other measurement equipment. As shown, the testing probe 100 may be coupled to the testing device 200 through one or more high-frequency cables 202 compatible with the probe connectors 112 of the probe 100.

In some embodiments, the orientation of the probe tips 102 of a testing probe 100 may vary from the plane of the probe substrate 108. In some embodiments, the orientation may be adjustable. FIGS. 3A and 3B are left and right side views of a non-limiting example of a testing probe 100.

As shown, in some embodiments, a probe tip 102, such as the first probe tip 102a or the second probe tip 102b, can be positioned such that it forms an angle 302a, 302b with a plane 300 of the printed circuit board 110 (e.g. the first tip 102a forming a first angle 302a (FIG. 3A), the second tip 102b forming a second angle 302b (FIG. 3B), etc.). According to various embodiments, these angles may range between 0° and 90°. In some embodiments, they may be limited to between 10° and 90°. Orienting the probe tips 102 in such a way allows for easier access to the testing surface or device being investigated with the testing probe 100. In some embodiments, the testing probe 100 may be arranged such that the probe tips 102, sitting at angles with respect to a plane 300 of the printed circuit board 110, have their first ends 104 and second ends 106 on opposite sides of the plane 300.

In some embodiments, these angles may be fixed at the time of manufacture, while in other embodiments these angles may be configured to be adjustable. For example, in some embodiments, the probe tips 102 may be coupled to the printed circuit board 110 through a conductive coupling 116a, 116b configured to receive a probe tip 102 in a portion of the conductive coupling 116a, 116b configured to pivot or turn about at least one axis while maintaining electronic communication between the tip 102 and its trace 114. The ability to adjust the orientation of one or more probe tips 102 would facilitate the testing of components having various widths between measurement contact points. Additional measures of orientation and adjustable embodiments will be discussed in greater detail with respect to FIGS. 4, 7A, and 7B, below.

In some embodiments, the probe tips 102 may also be oriented such that they are at an angle with respect to each other. FIG. 4 is a top view of a non-limiting example of a testing probe 100. As shown, the probe tips 102 are oriented such that the first probe tip 102a and second probe tip 102b are at an angle (e.g. third angle 400) with respect to each other. The third angle 400 (FIG. 4) may range from 0° to 90°, according to various embodiments.

In some embodiments, the probe tips 102 may be angled with respect to each other. In other embodiments, the tips 102 may be angled with respect to a plane 300 of the printed circuit board 110. In still other embodiments, the probe tips 102 may be angled with respect to each other and the PCB. In some embodiments, these angles may be uniform (e.g. all tips 102 are at the same non-zero angle with respect to plane 300, etc.) across the tips, while in other embodiments the angles may vary from tip to tip. Similar to the first 302a and second 302b angles discussed above, in some embodiments the third angle 400 (and it's equivalents in embodiments having more than two probe tips 102) may be fixed at the time of manufacture, while in other embodiments it/they may be adjustable after manufacture.

Figure 5:
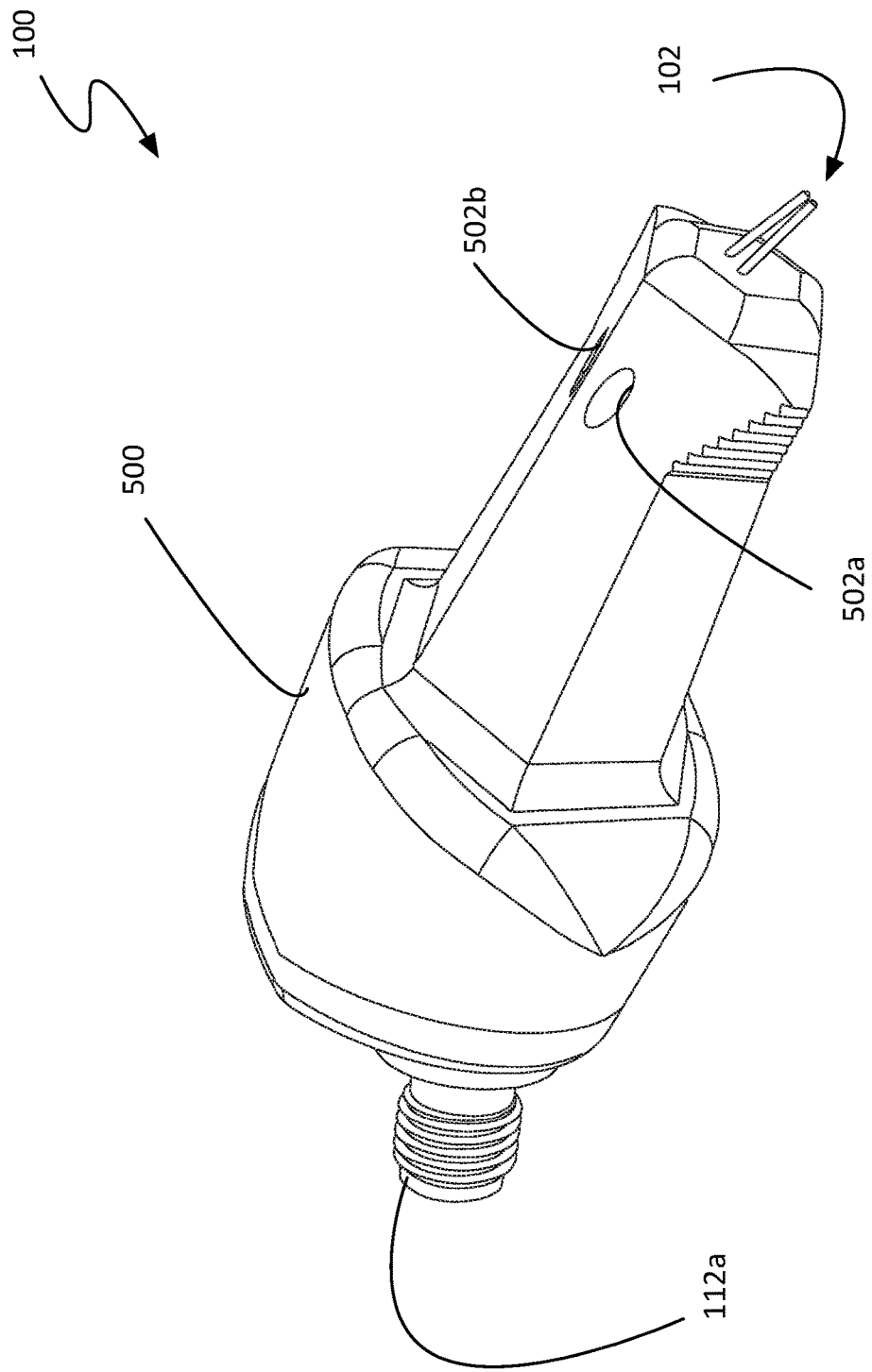
FIG. 5 is a perspective view of a high frequency testing probe with a probe housing.

FIG. 5 is a perspective view of a non-limiting example of a testing probe 100 having a probe housing 500. A probe housing 500 helps protect the sensitive components of the testing probe 100 from damage or interference that could compromise its performance as a testing instrument. According to various embodiments, the housing is comprised of a lossy material, such as acrylonitrile butadiene styrene (ABS) or polyvinyl chloride (PVC). The housing may further be internally coated with iron loaded silicone, ferrite loaded silicone, carbon loaded foam, or other similar materials suitable for shielding from radiated energy.

As shown, the housing 500 encloses at least a majority of the printed circuit board 110, to provide protection for the sensitive traces 114 and other components. In some embodiments, the entire printed circuit board 110 may be enclosed within the housing 500.

In some embodiments, the probe connectors 112 at the rear of the testing probe 100 may protrude through holes in the housing 500. In other embodiments, the probe connectors 112 may be coupled directly to the housing 500, taking advantage of its structure to further protect the printed circuit board 110.

As shown, the first end 104 of each probe tip 102 passes through the probe housing 500 (or through a hole in the probe housing 500) such that it can make contact with a device being tested without compromising the security of the probe housing 500.

As shown, the probe housing 500 may have one or more adjustment apertures 502a, 502b. In some embodiments, the second end 106 of the probe tips 102 may be positioned proximate the first and second adjustment apertures 502a, 502b, such that the adjustment apertures 502a, 502b provide limited access to the second end 106 of the probe tips 102 without exposing them to potential interferences or collisions with objects outside the housing 500. The use of the adjustment apertures 502a, 502b will be discussed in greater detail with respect to FIGS. 7A and 7B, below.

The probe housing 500 may be formed with a variety of shapes, depending upon the desired application. Embodiments designed to be used manually by and individual may be shaped to facilitate their grip and permitting fine control over the positioning of the probe tips 102. Embodiments designed for use in an automated setting, or on components too small to consistently measure manually may comprise a receiver or similar structure configured to permit the testing probe 100 to be mounted on another structure or device during use.

Figure 6:
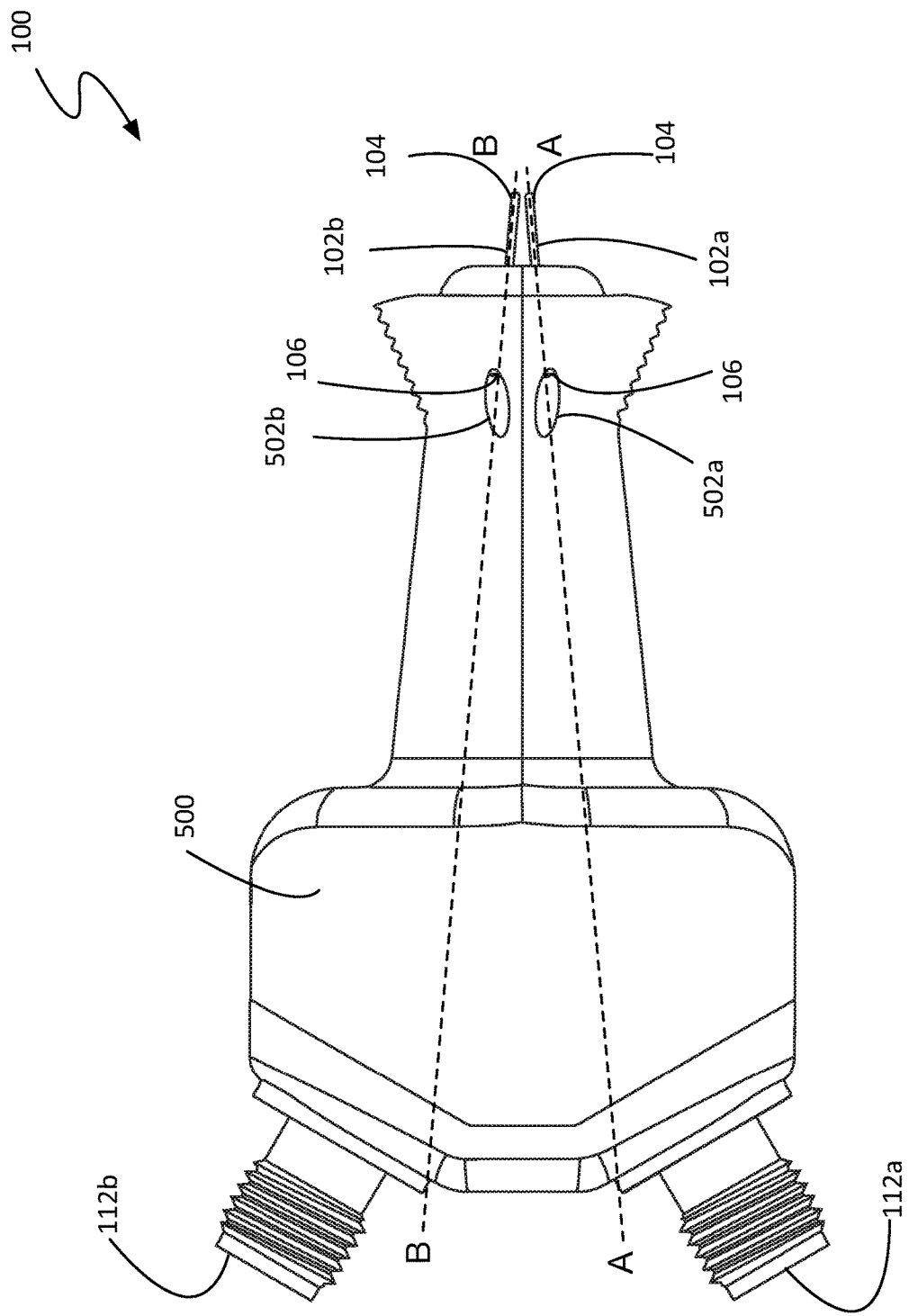
FIG. 6 is a top view of a high frequency testing probe with a probe housing.
Figure 7A:
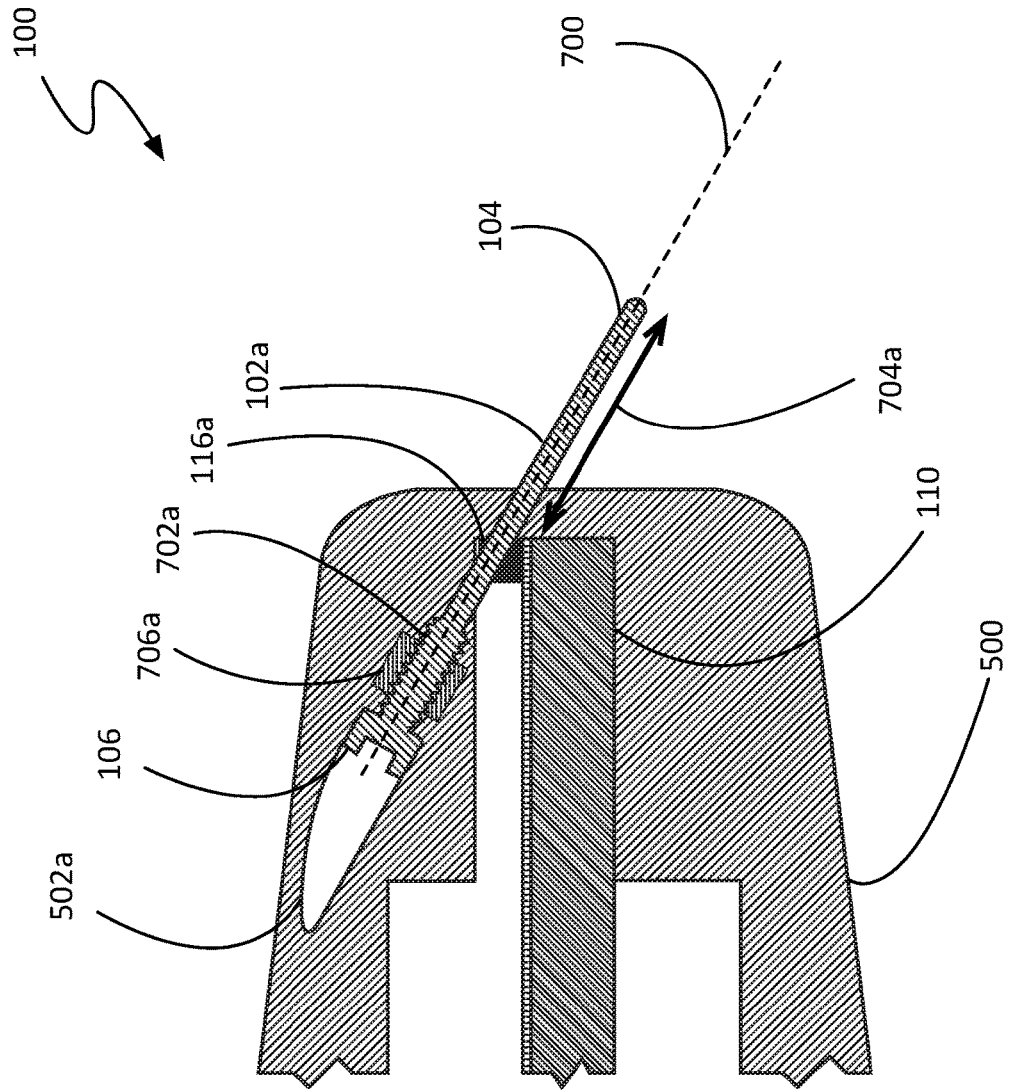
FIGS. 7A and 7B are cross-sectional side views of the testing probe of FIG. 6, taken along lines A-A and B-B, respectively.
Figure 7B:
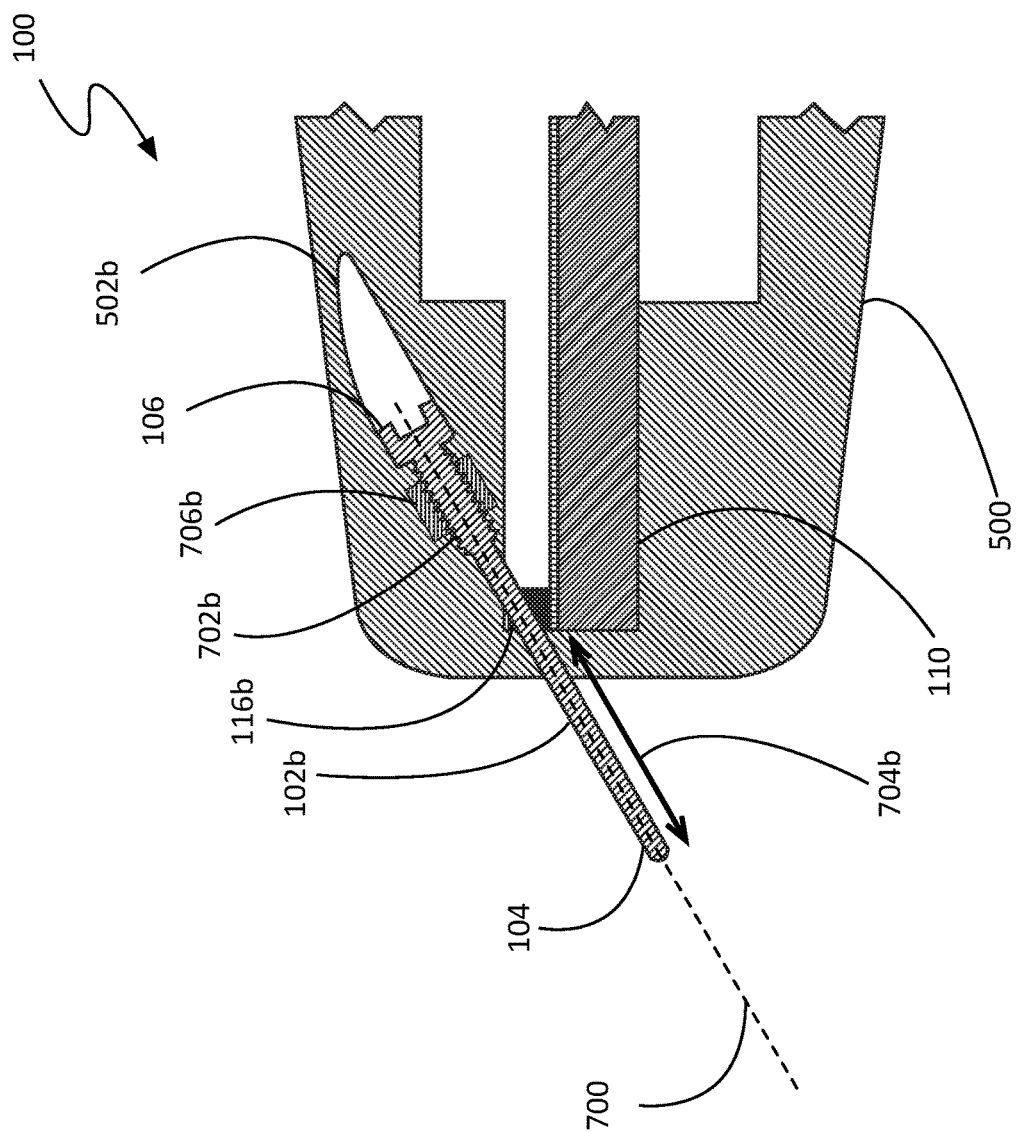

FIG. 6 is a top view of the non-limiting example of a testing probe 100 with a probe housing 500 shown in FIG. 5. As shown, lines A-A and B-B bisect the first adjustment aperture 502a and second adjustment aperture 502b, respectively. FIGS. 7A and 7B are left and right views of the cross-section of a testing probe 100 taken along lines A-A and B-B, respectively.

As previously mentioned, in some embodiments, the probe tips 102 may be fixed to the printed circuit board 110, while in others their orientation may be adjustable in one or more directions. According to various embodiments, the probe tips 102 may be adjustable such that the distance 704a, 704b between the first end 104 and the PCB 110 can be changed. This would allow the probe 100 to be used to more easily test devices at testing surfaces of different heights, a task that would be difficult for fixed tips 102.

In some embodiments, one or more tips 102 may be releasably coupled to the probe 100, such that they can be removed and reattached at a different degree of extension out from the PCB 110. In other embodiments, a probe tip 102 may be movably coupled to a structure such that the distance 704a, 704b of extension may be adjusted without breaking electrical communication between the tip and the trace. In other words, in some embodiments, the probe tips 102 may be translatable along their individual central longitudinal axis 700, such that the distance 704a, 704b between the first end 104 of the tip 102 changes, but all angles (e.g. angles 302a, 302b, angles 400, etc.) can be held fixed in particular embodiments, though not all angles are required to be held fixed in all embodiments. The embodiment shown and described in FIGS. 1-6 design advantageously allows for relatively rapid fine adjustment of the probe tips 102 to permit testing of a wide variety of electronic components, including components with differential height between contact points.

A specific, but non-limiting, example is shown in FIGS. 7A and 7B. As shown, each probe tip 102 has a threading 702a, 702b configured to mate with an adjustable coupling 706a, 706b within the probe housing 500 near the adjustment aperture 502a, 502b for that respective tip 102. The second end 106 of the tip 102 may be turned using a tool such as a screwdriver, threading the tip 102 into or out of the adjustable coupling 706a, 706b and the conductive coupling 116a, 116b, modifying the first and second distances 704a, 704b without compromising the electronic communication. In some embodiments, the adjustable coupling 706a, 706b is also the conductive coupling 116a, 116b, mounted on the PCB 110.

In some embodiments, the adjustable coupling 706a, 706b may be threaded, while in other embodiments the adjustable coupling 706a, 706b may make use of other mechanisms known in the art for releasable coupling, such as pressure clasps, insulating clamps, friction fitting, and the like.

Figure 8:
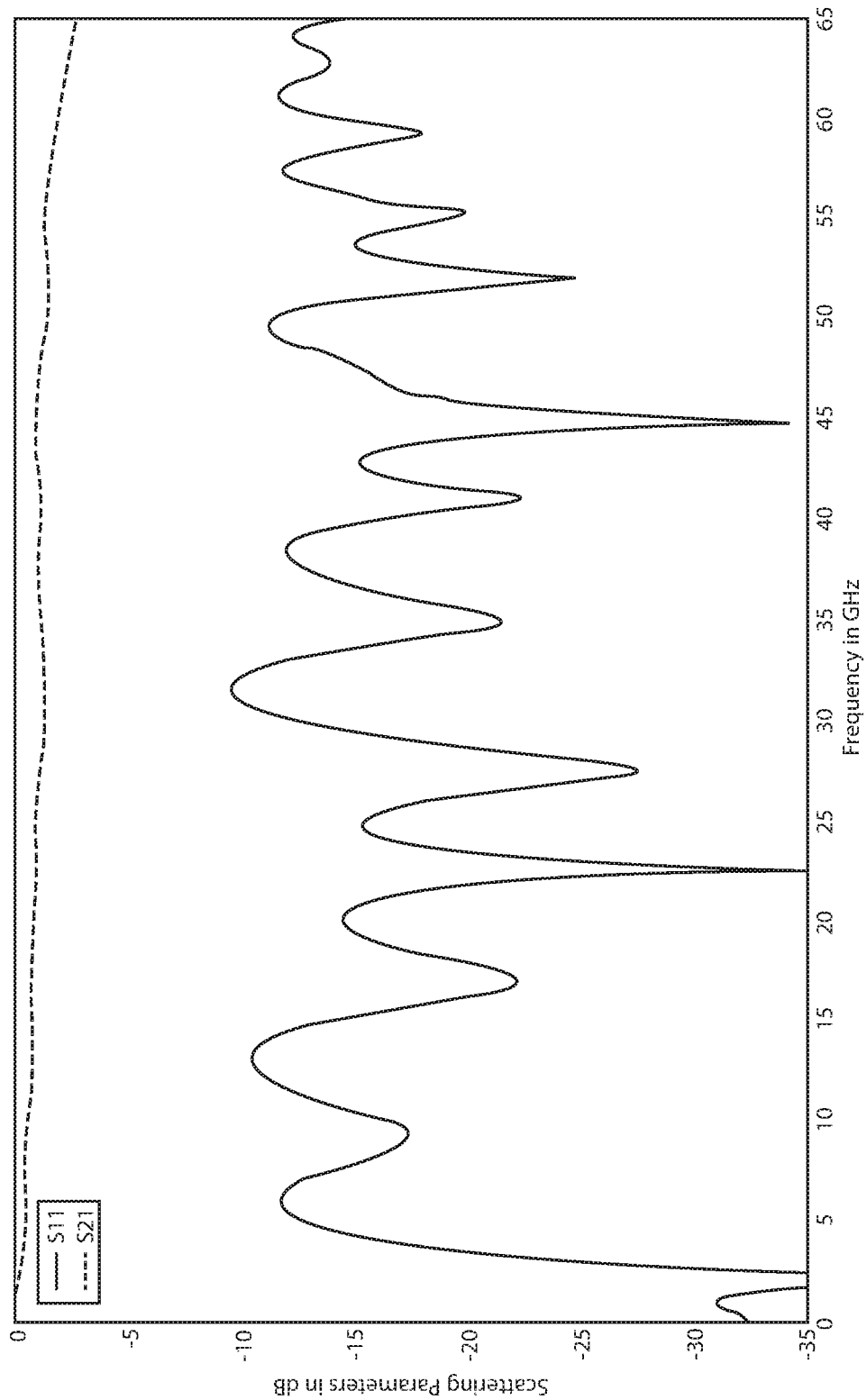
FIG. 8 is a plot of exemplary scattering parameters for a high frequency testing probe.

FIG. 8 shows exemplary performance (i.e. scattering parameters) of a non-limiting example of a testing probe 100. These measurements demonstrate the probe 100 expanding the range of frequencies over which the probe 100 reliably measures when compared with traditional cable probes; in this instance, a range up to 65 GHz. Greater frequencies still may be measured with probes 100 embodying the full teachings of this disclosure.

Where the above examples, embodiments and implementations reference examples, it should be understood by those of ordinary skill in the art that other testing probes and manufacturing methods and examples could be intermixed or substituted with those provided. In places where the description above refers to particular embodiments of a high-frequency testing probe and manufacturing methods, it should be readily apparent that a number of modifications may be made without departing from the spirit thereof and that these embodiments and implementations may be applied to other testing probes as well. Accordingly, the disclosed subject matter is intended to embrace all such alterations, modifications and variations that fall within the spirit and scope of the disclosure and the knowledge of one of ordinary skill in the art.

What is claimed is:

1. A high-frequency testing probe, comprising:
   a probe substrate comprising a printed circuit board;
   a probe housing enclosing the printed circuit board; and
   at least two probe tips directly coupled to and extending outward from the printed circuit board, the at least two probe tips configured to physically contact and test a device through the physical contact, each probe tip each probe tip having a first end and a second end distal to the first end, the at least two probe tips comprising:
      a first probe tip communicatively coupled to a first probe connector through a first conducting trace disposed upon the printed circuit board, the first conducting trace communicatively coupling the first probe tip only to the first probe connector, the first probe tip passing through the probe housing such that the first end of the first probe tip is outside the probe housing and the second end of the first probe tip is inside the probe housing, the first probe tip being positionally adjustable to a fixed position in relation to the printed circuit board through manual manipulation of a first adjustable coupling of the first probe tip to the probe substrate, the first adjustable coupling accessible at a first adjustment aperture in the probe housing; and a second probe tip communicatively coupled to a second probe connector through a second conducting trace, the second conducting trace being electrically isolated from the first conducting trace and communicatively coupling the second probe tip only to the second probe connector, the second probe tip passing through the probe housing such that the first end of the second probe tip is outside the probe housing and the second end of the second probe tip is inside the probe housing, the second probe tip being positionally adjustable in relation to the printed circuit board separate from the positional adjustability of the first probe tip through manual manipulation of a second adjustable coupling of the second probe tip to the probe substrate, the second adjustable coupling accessible at a second adjustment aperture in the probe housing;

wherein the plurality of probe connectors are disposed upon the printed circuit board and are configured to couple the high-frequency testing probe to at least one of a high-frequency vector network analyzer and a high-frequency time domain reflectometer;

wherein the first probe tip comprises a first threading and is threadedly received by and coupled to the probe housing through the first adjustable coupling, wherein turning the second end of the first probe tip rotates the first threading within the first adjustable coupling and changes a first distance the first end of the first probe tip extends outward from the printed circuit board;

wherein the second probe tip comprises a second threading and is threadedly received by and coupled to the probe housing through the second adjustable coupling, wherein turning the second end of the second probe tip rotates the second threading within the second adjustable coupling and changes a second distance the first end of the second probe tip extends outward from the printed circuit board;

wherein the first probe tip is coupled to the printed circuit board at a first angle with respect to a plane of the printed circuit board between 10° and 90°, the probe tip spanning a plane of the printed circuit board so that the first and second ends of the first probe tip are on opposite sides of the plane of the printed circuit board; and wherein the second probe tip is coupled to the printed circuit board at a second angle with respect to the plane of the printed circuit board between 0° and 90°, the first and second ends of the second probe tip being on opposite sides of the plane of the printed circuit board.

2. The high-frequency testing probe of claim 1, wherein the first probe tip is coupled to the printed circuit board at a third angle with respect to the second probe tip between 0° and 90°.

3. The high-frequency testing probe of claim 1, wherein the at least two probe tips are cylindrical and comprise heat-treated BeCu.

4. The high-frequency testing probe of claim 1, wherein the at least two probe tips comprises at least three probe tips.

5. The high-frequency testing probe of claim 1, wherein the printed circuit board comprises polytetrafluoroethylene (PTFE).

6. A high-frequency testing probe, comprising:
a probe substrate comprising a printed circuit board;
at least two probe tips directly coupled to and extending outward from the printed circuit board, the at least two probe tips configured to physically contact and test a device through the physical contact, each probe tip having a first end and a second end distal to the first end, the at least two probe tips comprising:

a first probe tip communicatively coupled to a first probe connector through a first conducting trace disposed upon the printed circuit board, the first conducting trace communicatively coupling the first probe tip only to the first probe connector, wherein prior to contact with the device to be tested the first probe tip being positionally adjustable to a fixed position in relation to the printed circuit board through manual manipulation of a first adjustable coupling of the first probe tip to the probe substrate; and a second probe tip communicatively coupled to a second probe connector through a second conducting trace, the second conducting trace being electrically isolated from the first conducting trace and communicatively coupling the second probe tip only to the second probe connector, wherein prior to contact with the device to be tested the second probe tip being positionally adjustable to a fixed position in relation to the printed circuit board through manual manipulation of a second adjustable coupling of the second probe tip to the probe substrate;

wherein first probe connector and the second probe connector are disposed upon the printed circuit board and are configured to couple the high-frequency testing probe to at least one of a high-frequency vector network analyzer and a high-frequency time domain reflectometer;

wherein the first probe tip is received by and adjustably coupled to the first adjustable coupling, wherein the first probe tip translates along its central longitudinal axis through the first adjustable coupling to modify a first distance the first end of the first probe tip extends outward from the printed circuit board; and wherein the second probe tip is received by and adjustably coupled to the second adjustable coupling, wherein the second probe tip translates along its central longitudinal axis through the second adjustable coupling to modify a second distance the first end of the second probe tip extends outward from the printed circuit board.

7. The high-frequency testing probe of claim 6:
wherein the first probe tip comprises a first threading and is threadedly received by the first adjustable coupling, wherein turning the second end of the first probe tip rotates the first threading within the first adjustable coupling and changes the first distance the first end of the first probe tip extends outward from the printed circuit board; and wherein the second probe tip comprises a second threading and is threadedly received by the second adjustable coupling, wherein turning the second end of the second probe tip rotates the second threading within the second adjustable coupling and changes the second distance the first end of the second probe tip extends outward from the printed circuit board.

8. The high-frequency testing probe of claim 6, wherein the first probe tip is coupled to the printed circuit board at a first angle with respect to a plane of the printed circuit board between 10° and 90°, the probe tip spanning a plane of the printed circuit board so that the first and second ends of the first probe tip being on opposite sides of the plane of the printed circuit board.

9. The high-frequency testing probe of claim 6, wherein the first probe tip is coupled to the printed circuit board at a third angle with respect to the second probe tip between 0° and 90°.

10. The high-frequency testing probe of claim 6, wherein the at least two probe tips are cylindrical.

11. The high-frequency testing probe of claim 6, further comprising:
a probe housing enclosing a majority of the printed circuit board;
wherein the first probe tip passes through the probe housing such that the first end of the first probe tip is outside the probe housing and the second end of the first probe tip is proximate a first adjustment aperture in the probe housing; and
wherein the second probe tip passes through the probe housing such that the first end of the second probe tip is outside the probe housing and the second end of the second probe tip is proximate a second adjustment aperture in the probe housing.

12. The high-frequency testing probe of claim 6, wherein the printed circuit board comprises polytetrafluoroethylene (PTFE).

13. A high-frequency testing probe, comprising:
a probe substrate comprising a printed circuit board;
at least two probe tips directly coupled to and extending outward from the printed circuit board, the at least two probe tips configured to contact and test a device through the physical contact, each probe tip having a first end and a second end distal to the first end, the at least two probe tips comprising:
a first probe tip communicatively coupled to a first probe connector through a first conducting trace disposed upon the printed circuit board, the first conducting trace communicatively coupling the first probe tip only to the first probe connector, wherein prior to contact with the device to be tested the first probe tip being positionally adjustable to a fixed position in relation to the printed circuit board through manual manipulation of a first adjustable coupling of the first probe tip to the probe substrate; and
a second probe tip communicatively coupled to a second probe connector through a second conducting trace, the second conducting trace being electrically isolated from the first conducting trace and communicatively coupling the second probe tip only to the second probe connector, wherein prior to contact with the device to be tested the second probe tip being positionally adjustable to a fixed position in relation to the printed circuit board through manual manipulation of a second adjustable coupling of the second probe tip to the probe substrate;
wherein the first probe connector and the second probe connector are disposed upon the printed circuit board and are configured to couple the high-frequency testing probe to at least one of a high-frequency vector network analyzer and a high-frequency time domain reflectometer and test signals between 40-70 GHz.

14. The high-frequency testing probe of claim 13, wherein the first probe tip is received by and adjustably coupled to a first adjustable coupling, wherein the first probe tip translates along its central longitudinal axis through the first adjustable coupling to modify a first distance the first end of the first probe tip extends outward from the printed circuit board.

15. The high-frequency testing probe of claim 14, wherein the first probe tip comprises a first threading and is threadedly received by the first adjustable coupling, wherein turning the second end of the first probe tip rotates the first threading within the first adjustable coupling and changes the first distance the first end of the first probe tip extends outward from the printed circuit board.

16. The high-frequency testing probe of claim 13, wherein the first probe tip is coupled to the printed circuit board at a first angle with respect to a plane of the printed circuit board between 10° and 90°.

17. The high-frequency testing probe of claim 13, wherein the first probe tip is coupled to the printed circuit board at a third angle with respect to the second probe tip between 0° and 90°.

18. The high-frequency testing probe of claim 13, wherein the at least two probe tips comprise heat-treated BeCu.

19. The high-frequency testing probe of claim 13, further comprising:
a probe housing enclosing a majority of the printed circuit board;
wherein the first probe tip passes through the probe housing such that the first end of the first probe tip is outside the probe housing and the second end of the first probe tip is proximate a first adjustment aperture in the probe housing; and
wherein the second probe tip passes through the probe housing such that the first end of the second probe tip is outside the probe housing and the second end of the second probe tip is proximate a second adjustment aperture in the probe housing.

20. The high-frequency testing probe of claim 13, wherein the printed circuit board comprises polytetrafluoroethylene (PTFE).

* * * * *